(12) United States Patent
Bedeschi et al.

(10) Patent No.: US 8,223,535 B2
(45) Date of Patent: Jul. 17, 2012

(54) PHASE-CHANGE MEMORY DEVICE WITH DISCHARGE OF LEAKAGE CURRENTS IN DESELECTED BITLINES AND METHOD FOR DISCHARGING LEAKAGE CURRENTS IN DESELECTED BITLINES OF A PHASE-CHANGE MEMORY DEVICE

(75) Inventors: Ferdinando Bedeschi, Monza (IT); Claudio Resta, Pavia (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 381 days.

(21) Appl. No.: 12/560,235

(22) Filed: Sep. 15, 2009

(65) Prior Publication Data
US 2010/0128517 A1  May 27, 2010

(30) Foreign Application Priority Data
Sep. 16, 2008  (IT) .............................. TO2008A0677

(51) Int. Cl.
*G11C 11/00* (2006.01)
(52) U.S. Cl. ....................................... 365/163; 365/226
(58) Field of Classification Search ............. 365/163 O, 365/203, 204, 226 X, 163, 226
See application file for complete search history.

(56) References Cited

U.S. PATENT DOCUMENTS

| | | | |
|---|---|---|---|
| 6,909,639 B2 * | 6/2005 | Park et al. ................ | 365/185.25 |
| 7,092,277 B2 | 8/2006 | Bedeschi et al. | |
| 2004/0228163 A1 | 11/2004 | Khouri et al. | |
| 2008/0291715 A1 | 11/2008 | Park et al. | |

FOREIGN PATENT DOCUMENTS

EP   1548745 A1   6/2005

* cited by examiner

*Primary Examiner* — VanThu Nguyen
(74) *Attorney, Agent, or Firm* — Seed IP Law Group PLLC (57) ABSTRACT

A phase change memory device includes a bitline biasing unit; and a bitline selection unit connecting a selected bitline to the bitline biasing unit and disconnecting deselected bitlines from the bitline biasing unit in an operative condition. A bitline discharge unit is connected to the bitlines to discharge leakage currents in the bitlines. The bitline discharge unit has a voltage regulation unit and a plurality of bitline discharge switches coupled between the voltage regulation unit and a respective bitline. The bitline discharge switches are controlled to connect the deselected bitlines to the voltage regulation unit and to disconnect the selected bitline from the voltage regulation unit. The voltage regulation unit comprises a PMOS transistor coupled between a regulated voltage bus and a reference potential line. The regulated voltage bus is connected to the bitline discharge switches and the control terminal of the PMOS transistor is biased to a constant voltage.

21 Claims, 10 Drawing Sheets

PHASE-CHANGE MEMORY DEVICE WITH DISCHARGE OF LEAKAGE CURRENTS IN DESELECTED BITLINES AND METHOD FOR DISCHARGING LEAKAGE CURRENTS IN DESELECTED BITLINES OF A PHASE-CHANGE MEMORY DEVICE

BACKGROUND

1. Technical Field

The present disclosure relates to a phase-change memory device having a circuit that discharges leakage currents in deselected bitlines and a method for discharging leakage currents in deselected bitlines of a phase-change memory device.

2. Description of the Related Art

As is known, phase change memories are formed by memory cells connected at the intersections of bitlines and wordlines and comprising each a memory element and a selection element. A memory element comprises a phase change region made of a phase change material, i.e., a material that may be electrically switched between a generally amorphous and a generally crystalline state across the entire spectrum between completely amorphous and completely crystalline states.

Typical materials suitable for the phase change region of the memory elements include various chalcogenide elements. The state of the phase change materials is non-volatile, absent application of excess temperatures, such as those in excess of 150° C., for extended times. When the memory is set in either a crystalline, semi-crystalline, amorphous, or semi-amorphous state representing a resistance value, that value is retained until reprogrammed, even if power is removed.

Selection elements may be formed according to different technologies, for example they can be implemented by diodes, by MOS transistors or bipolar transistors.

Figure 1:
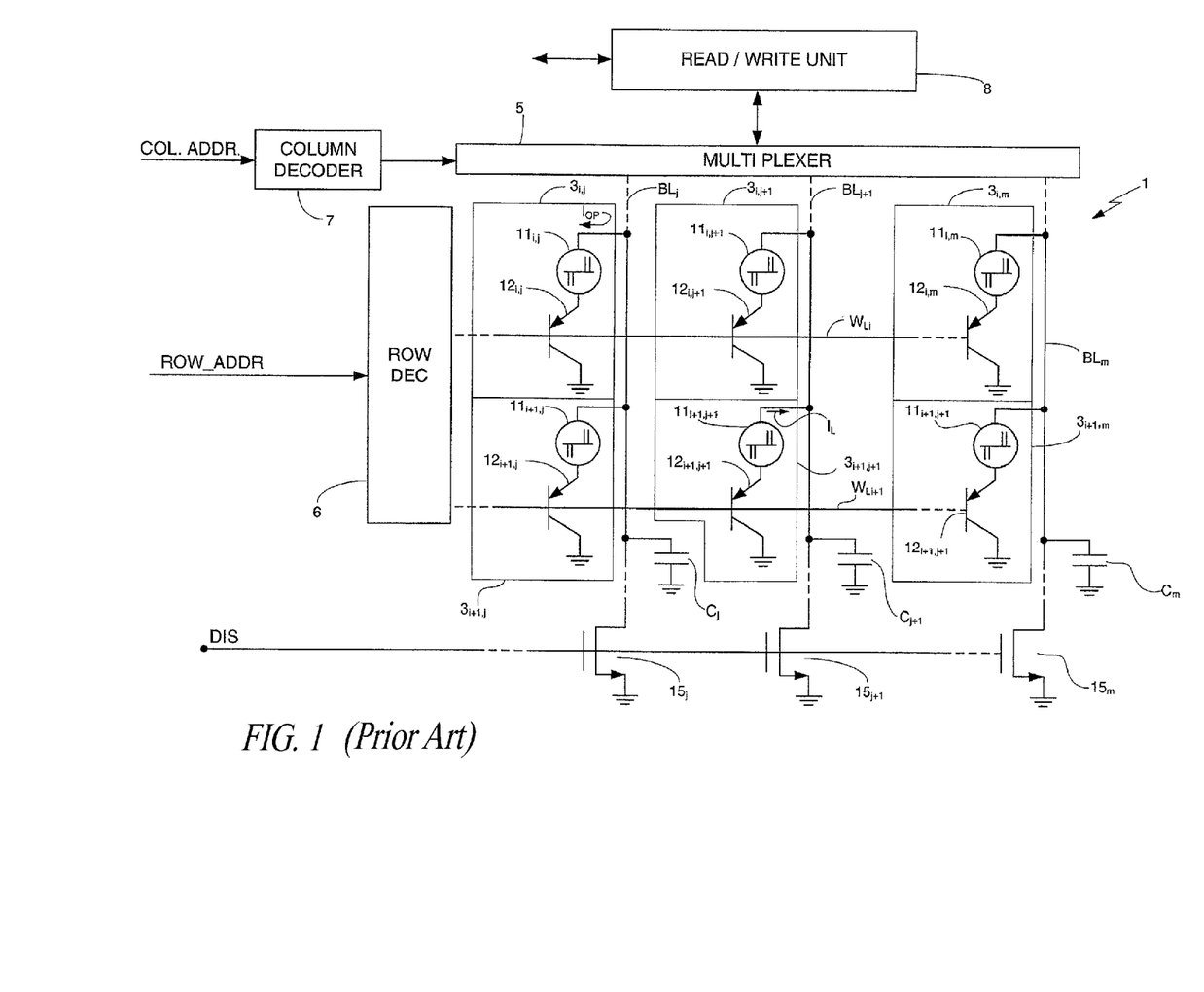
FIG. 1 shows a block diagram of a known phase-change memory device.

With reference to FIG. 1, a phase-change memory device 1 comprises an array 2 of PCM cells 3, arranged in rows and columns and connected to a row decoder 6 receiving row address signals ROW_ADDR and to a multiplexer 5 controlled by a column decoder 7 receiving column address signals COL_ADDR. The multiplexer 5 is connected to a write/read unit 8 including all the components (such as sense amplifiers, comparators, charge pumps, reference cells, voltage sources, voltage regulators) necessary for writing or reading the PCM cells 3.

Each PCM cell 3 comprises a phase-change memory element 11 and a selection element 12 coupled in series. Each phase-change memory element 11 includes a portion of a phase-change material and is therefore suitable for storing data in form of respective resistance levels associated to different phases of the phase-change material, as above explained. In the embodiment shown, the selection elements 12 are a PNP bipolar transistors controlled to allow current to flow through the respective memory elements 11 during reading and programming/verifying operations. Each phase-change memory element 11 is directly connected to a respective bit line BL and is connected to a respective word line WL through the selection element 12.

Groups of PCM cells 3 are selectively addressable by the row decoder 6 and the multiplexer 7, as specified by address signals ROW_ADDR and COL_ADDR. The multiplexer 5 and the write/read unit 8 bias selected bitlines BL to biasing voltages, depending on the operating phase, and disconnect unselected bitlines BL, which are thus floating. The row decoder 6 connects selected word lines WL to a low voltage (close to ground) and unselected word lines 16 to a relatively high voltage (typically 1.3 V during reading and 3.8 V during writing).

Each bitline BL is also connected to an own discharge transistor 15. Discharge transistors 15 are NMOS transistors having drain terminals connected to own bitlines BL, gate terminals connected together and receiving a control signal DIS and source terminals connected to ground.

FIG. 1 also shows capacitors 16, representing the capacitance of the bitlines BL and thus connected each between an own bitline BL and ground.

In FIG. 1, three bitlines $BL_j$, $BL_{j+1}$ and $BL_m$ and two wordlines $WL_i$ and $WL_{1+1}$ are shown. The cells 3, the memory elements 11 and the selection elements 12 are thus identified also with a pedal corresponding to the wordline WL and the bitline BL they are coupled to. Analogously, discharge transistors 15 and capacitors 16 are identified with a subscript corresponding to the respective bitline $BL_j$, $BL_{j+1}$ and $BL_m$, .

The discharge transistors 15 have the aim of discharging leakage currents flowing along the respective bitlines. In particular, during standby or before a reading/writing operation, all the bitlines are left floating and the wordlines are biased at a high voltage VPCX. Furthermore, control signal DIS is high and maintains the discharge transistors 15 on. Thus, all the bitlines BL are connected to ground. In such a situation, the base-emitter junctions of the selection elements 12 are inversely biased and conduct each a discharge current flowing from the row decoder 6 toward ground through the bitlines and the discharge transistors 15. Thereby, the voltage on the bitlines BL cannot increase and the capacitors 16 are discharged.

During a proper reading/writing operation, the discharge transistors 15 are switched off by the control signal DIS; the selected wordline is grounded; the selected bitline is brought to a value $V_{BL}$, as required by the specific operation; the deselected wordlines are brought to a high value VPCX and the deselected bitlines are left floating.

For example, if cell $3_{i,j}$ is to be read or written, wordline $WL_i$ is grounded and bitline $BL_j$ is biased to voltage $V_{BL}$. Therefore, a current $I_{op}$ flows through cell $3_{i,j}$. The cells $3_{i+1,j+1}$, $3_{i+1,m}$, connected to the deselected bitlines $BL_{j+1}, \ldots, BL_m$ and to the deselected wordline $WL_{i+1}$ conduct a leakage current $I_L$ which flows toward the cells $3_{i,j+i}, \ldots, 3_{i,m}$ connected to the selected wordline $WL_i$ and the deselected bitlines $BL_{j+1}, \ldots, BL_m$. This leakage current $I_L$ is a disturbance. In fact, depending of the temperature and on the number of bitlines, it can cause the voltage on the unselected bitlines to increase up to the switch-on value of the deselected selection elements $11_{i,j+i}, \ldots, 11_{i,m}$ connected to the selected wordline $WL_i$, causing an erroneous reading of the deselected memory elements $3_{i,j+i}, \ldots, 3_{i,m}$.

For example, if the threshold voltage Vth of the selection elements 11 at 120° C. is Vth=0.6 V, a critical condition occurs when the voltage on a generic deselected bitline reaches VBL=0.6+0.6=1.2 V. In the worst condition (when the memory element connected to the selected bitline is in the amorphous state and has a resistance of 1 MΩ), the current flowing through the deselected cells $3_{i,j+i}, \ldots, 3_{i,m}$ is 0.6/$10^6$=600 nA.

If 2000 cells are connected to each bitline BL, the cell leakage current $I_L$ requested from each non-selected cell $3_{i+1,j+1}, 3_{i+1,m}$ to cause switch-on of the cells $3_{i,j+i}, \ldots, 3_{i,m}$ is $I_L$=600/2000=300 pA. If the voltage on the deselected wordlines VPCX=4.5 V, the above cell leakage current $I_L$ is reached, since the base-to-emitter voltage on each deselected selection elements $11_{i,j+i}, \ldots, 11_{i,m}$ is about $$V_{BE} = -(4.5-1.2)V = -(3.3)V.$$

To solve this problem, U.S. Pat. No. 7,092,277 provides a dummy bitline, connected to dummy cells, in turn connected to the wordlines of the memory array. The dummy bitline is connected to the bitlines of the memory array through a current mirror circuit and forces a preset discharge current through the bitlines. Thus, the deselected bitlines cannot be charged at dangerous voltage levels.

However, this solution entails regulation circuitry that increases the power dissipation.

BRIEF SUMMARY

One embodiment is a phase-change memory device allowing discharge of leakage currents in deselected bitlines.

One embodiment is a phase change memory device that includes an array of memory cells, a bitline biasing unit, a bitline selection unit, and a bitline discharge unit. The memory cells are arranged in a plurality of rows and columns, each memory cell including a phase change memory element and a selection element. The array includes a plurality of wordlines and a plurality of bitlines, the memory cells of each row being coupled to a respective wordline and the memory cells of each column being coupled to a respective bitline. The bitline selection unit is coupled to said bitlines and said bitline biasing unit and is configured to connect a selected bitline to the bitline biasing unit and disconnect deselected bitlines from the bitline biasing unit in an operative condition of the memory device. The bitline discharge unit is coupled to the bitlines and includes a voltage regulation unit and a plurality of bitline discharge switches. Each bitline discharge switch is coupled between the voltage regulation unit and a respective bitline and is controlled in the operative condition to connect the deselected bitlines to the voltage regulation unit and disconnect the selected bitline from the voltage regulation unit.

BRIEF DESCRIPTION OF THE SEVERAL VIEWS OF THE DRAWINGS

For the understanding of the present disclosure, a preferred embodiment is now described, purely as a non-limitative example, with reference to the enclosed drawings, wherein.

DETAILED DESCRIPTION

Figure 2:
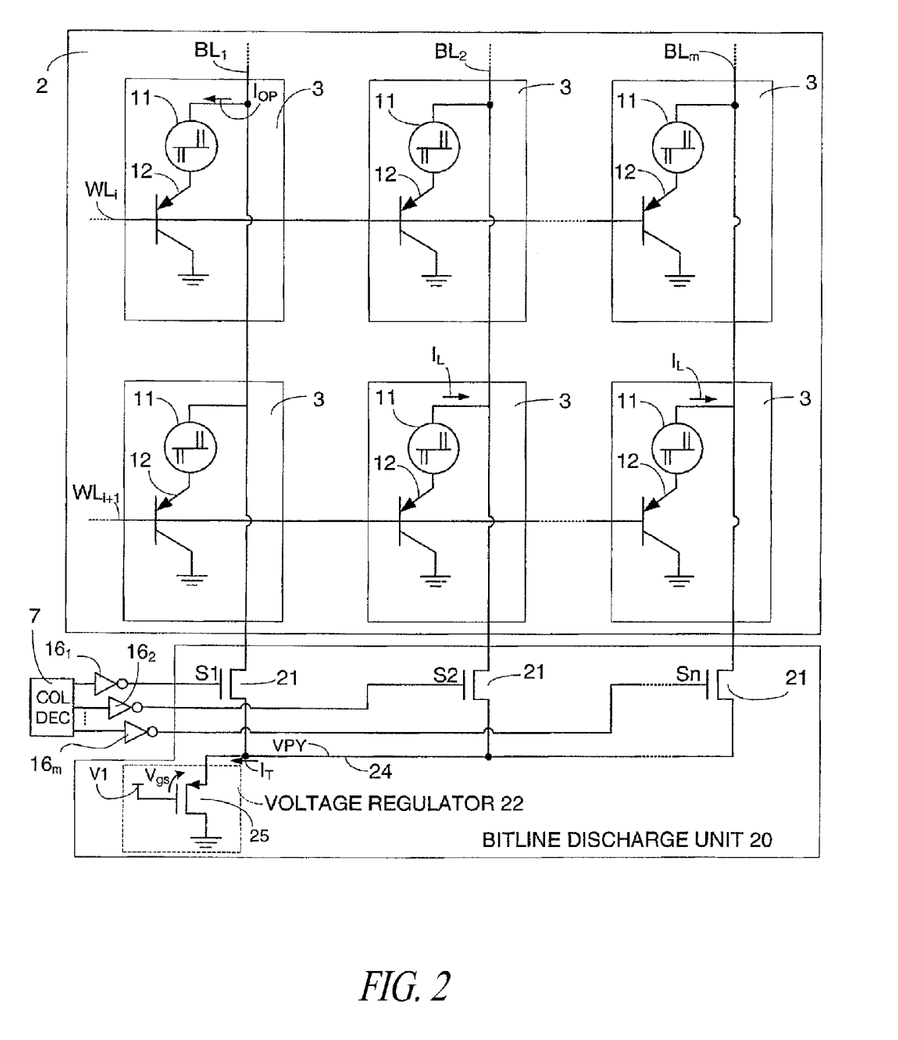
FIG. 2 shows a first embodiment of the present bitline discharge circuit connected to a phase change memory array.

FIG. 2 shows a memory array 2 of a phase change memory device having the general structure shown in FIG. 1. Accordingly, the memory array 2 includes a plurality of memory cells 3, each formed by a memory element 11 and a selection element 12. The memory elements 11 are phase change memory elements and the selection elements 12 are here bipolar transistors of the PNP type, having base terminals connected to wordlines WLi, WLi+1, . . . , collector regions connected to ground and emitter terminals connected to respective bitlines BL1, BL2, . . . , BLm through respective memory elements 11.

The bitlines BL of the memory array 2 are connected to a bitline discharge unit 20 including a plurality of bitlines discharge switches 21 and a voltage regulation stage 22.

In detail, the bitlines discharge switches 21 are formed here by NMOS transistors and each bitline BL1, BL2, . . . , BLm is connected to a drain terminal of an own bitline discharge switch 21 receiving, on an own gate terminal, an own selection signal S1, S2, . . . , Sm. Selection signals S1, S2, . . . , Sm may be obtained from inverting the column signals used to select the bitlines BL, generated by the column decoder 7, as indicated schematically in FIG. 2, wherein inverters $16_1$, $16_2$, . . . , $16_m$ are connected to the outputs of the column decoder 7. Furthermore, source terminals of all the bitline discharge switches 21 are connected together and to a discharge bus 24.

The voltage regulation stage 22 comprises here a regulation transistor 25 of the PMOS type having a source terminal connected to the discharge bus 24, a gate terminal connected to a biasing voltage V1 and a drain terminal connected to ground.

In operation, during reading/writing, all the bitlines BL, except for the selected bitline, are connected by the own bitline discharge switch 21 to the regulation transistor 25. The regulation transistor 25 drains the leakage currents $I_L$ injected by the deselected selection elements 12 and flowing along the deselected bitlines BL toward ground. The selected bitline is decoupled from the regulation transistor 25, so that it is not affected by the operation of the voltage regulation stage 22.

The regulation transistor 25 regulates the bus voltage VPY on the discharge bus 25; in fact, if the bus voltage VPY increases, also the gate-to-source voltage $V_{gs}$ of the regulation transistor 25 increases. Thus, the overall leakage current $I_T$ (sum of all the leakage currents $I_L$ flowing through the deselected bitlines BL and pulled by the regulation transistor 25) increases, discharging the deselected bitlines and causing a reduction of the bus voltage VPY.

In practice, by knowing the typical values of the leakage current $I_L$, it is possible to dimension the regulation transistor 25 and the biasing voltage V1 to ensure the regulated value of the bus voltage VPY and thus the proper operation of the voltage regulation stage 22.

During stand-by, all the bitline discharge switches 21 are on, thus ensuring discharge of all the bitlines BL.

Thus, the bitline discharge unit 20 regulates automatically the voltage on the discharge bus 24 and thus on the deselected bitlines BL to ensure discharge of leakage currents, thus preventing switching on of the selection elements of deselected memory cells and errors in the operation of the memory device.

Figure 3:
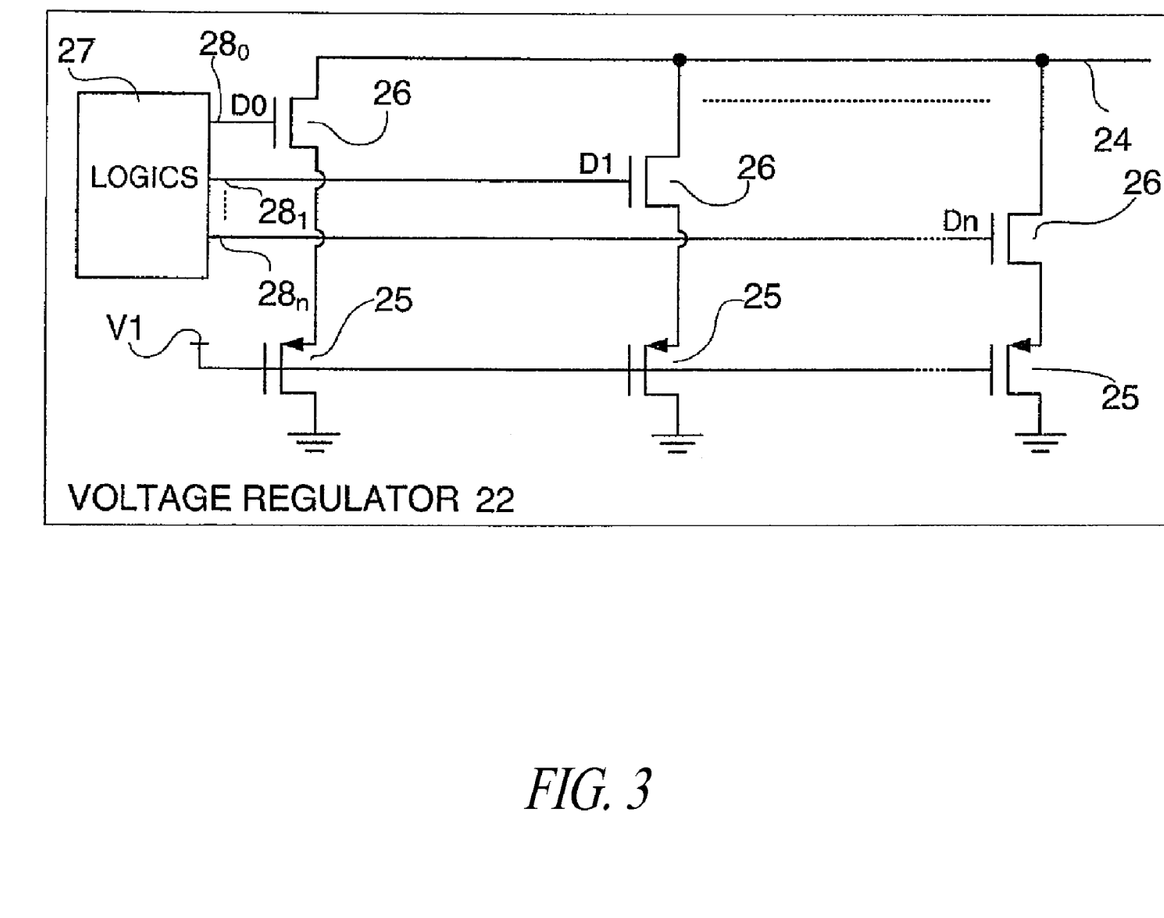
FIG. 3 shows a second embodiment of the present bitline discharge circuit.

FIG. 3 shows an embodiment, wherein the current capability of the voltage regulation stage 22 may be adjusted, according to the operation of the memory device and/or may be trimmed according the specific requirements or to compensate any fabrication value deviation.

In detail, here the voltage regulation stage 22 comprises n regulation transistors 25 parallel connected between the discharge bus 24 and ground through respective regulation switches 26 receiving each a control signal D0, D1, . . . , Dn generated by a logic unit 27.

In use, a selectable number of regulation transistors 25 may be connected in parallel by the logic unit 27, depending on the desired current capacity. For example, during writing, the voltages applied to the bitlines are higher, so is the overall leakage current $I_T$, with respect to stand-by. Thereby, during writing, a higher number of regulation transistors 25 may be coupled to the discharge bus 24 than during stand-by. In this case, the logic unit 27 may simply comprise an operative input, receiving a logic signal indicative of the operation (reading/writing/stand-by) of the memory device 2, and a switching matrix to couple a corresponding number of outputs $28_0$-$28_n$ to a high voltage, for example Vcc, to generate a high state of the corresponding control signals D0, D1, ..., Dn.

The structure of FIG. 3 allows also a trimming of the bitline discharge unit 20 to ensure the correct bus voltage VPY to take into account, e.g., the spread in the overall leakage current $I_T$ due to manufacturing. To this end, the logic unit 27 may be connected to a circuit for measuring the bus voltage VPY and comparing the measured value with a reference one to detect a bus voltage error; the logic unit 27 may thus cause switching on of a number of the regulation switches 26 based on the bus voltage error.

Figure 4:
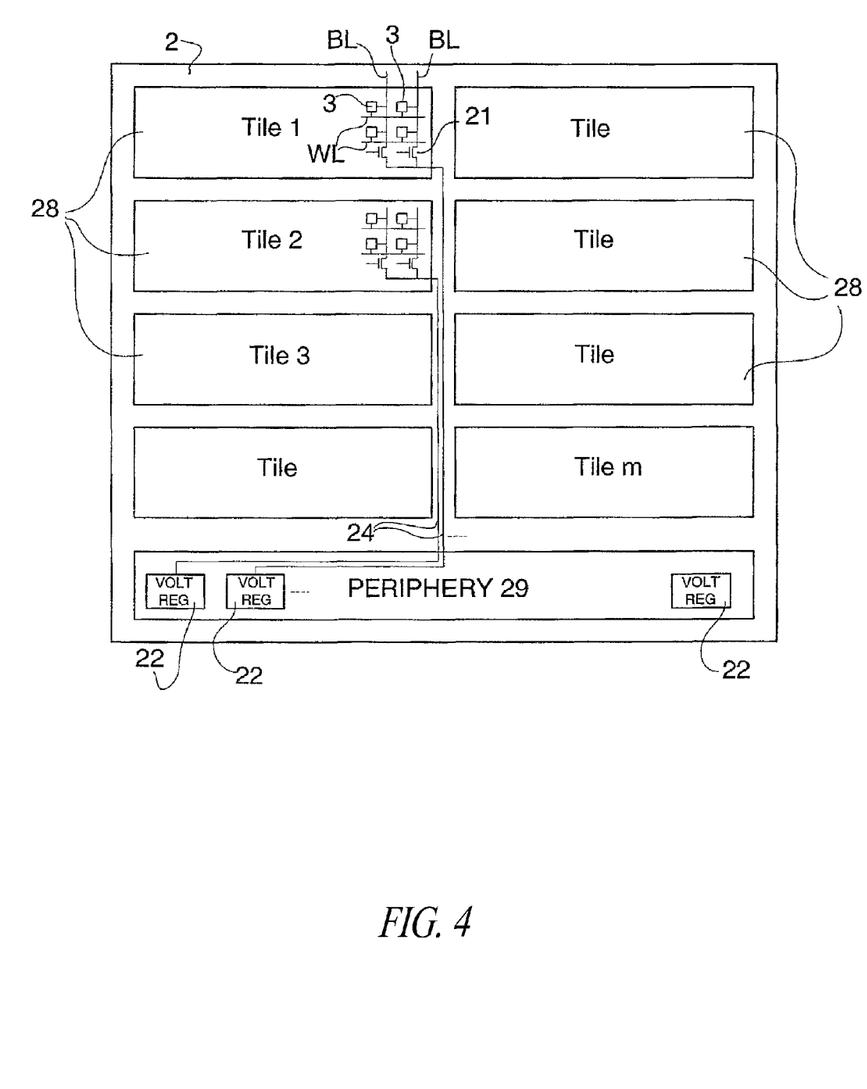
FIG. 4 shows an architecture of a phase change memory device including the present bitline discharge circuit.
Figure 5:
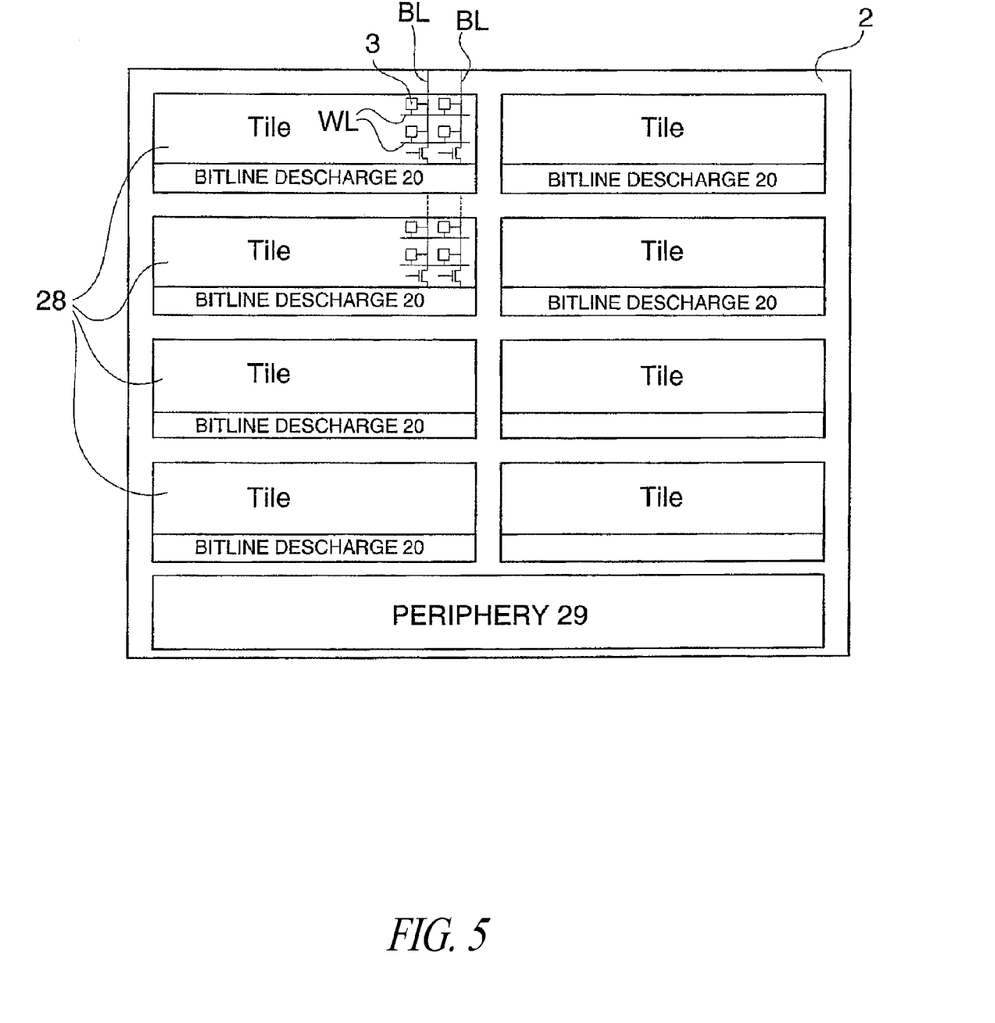
FIG. 5 shows another architecture of a phase change memory device including the present bitline discharge circuit.
Figure 6:
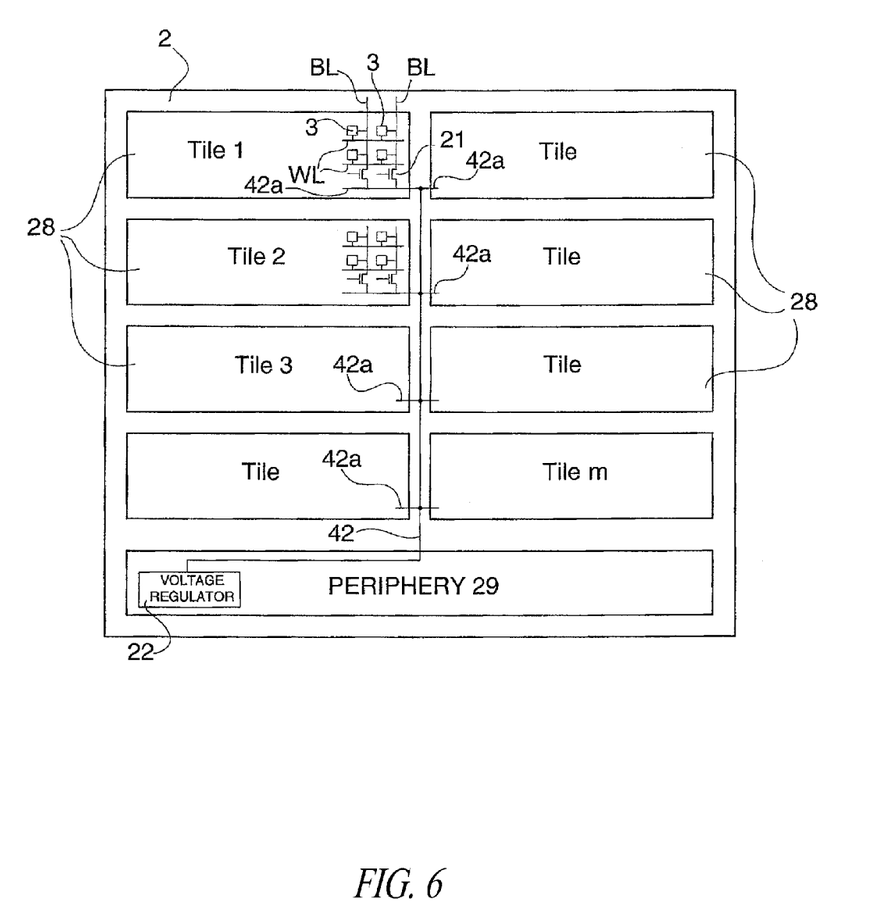
FIG. 6 shows still another architecture of a phase change memory device including the present bitline discharge circuit.

The voltage regulation stage 22 of FIGS. 2 and 3 may be arranged as shown in FIG. 4, 5 or 6.

In FIG. 4, wherein the memory array 2 is divided in a plurality of tiles 28 (each tile 28 comprising, e.g., 1,024 word lines), each tile 28 is coupled to an own bitline discharge unit 20. Here, all the voltage regulation stages 22 are arranged in a periphery portion 29 of the memory array 2 and the bitline discharge switches 21 of a tile 28 are arranged near the respective bitlines BL. The voltage regulation stages 22 are connected to the respective bitline discharge switches 21 through own discharge buses 24 running through the memory array. This solution is suitable for example for the embodiment of FIG. 2.

FIG. 5 shows a different architecture, wherein each bitline discharge unit 20 is arranged near a respective tile 28. This solution does not require the use of buses and the discharge buses 24 are formed by simple connection lines, e.g., formed in a low metallization level. This solution is suitable for example for the embodiment of FIG. 3.

According to FIG. 6, the bitline discharge unit 20 comprises a single voltage regulation stage 22 coupled to all the tiles 28 through a global discharge bus 42 (formed in a high-level metal line). The global discharge bus 42 is connected to the bitline discharge switches 21 of each tile 28 through a local discharge bus 42a.

In a memory array 2 of the type shown in FIGS. 4-6, including a plurality of tiles 28, more tiles 28 may be activated (read/written) simultaneously. In this case, the leakage currents to be discharged may be high, due to repeated reading and/or writing operations; thus, the quantity of electrical charges to be drained from the bitlines may be very high. Furthermore, during a reading operation, the bitline discharge units 20 are requested to drain both the leakage currents $I_L$ of the deselected cells 3 and the charge stored by the parasitic capacitors $C_j$-$C_m$ (FIG. 1) of the selected bitlines during reading. In fact, during reading, the selected bitlines BL are biased at a preset voltage, e.g., 1.4 V, and then are discharged to the bus voltage VPY through the bitlines discharge switches 21. While discharging from the selected to the deselected condition, the bitlines BL inject a discharge current in the discharge bus 24, which may cause such an increase in the bus voltage VPY that the automatic voltage regulation afforded by the voltage regulation stage 22 is not sufficient. In such a situation, the voltage regulation stage 22 may be combined with a close-loop voltage regulator including a comparator, for example of an on-off type, which can be activated only in presence of current peaks.

Figure 7:
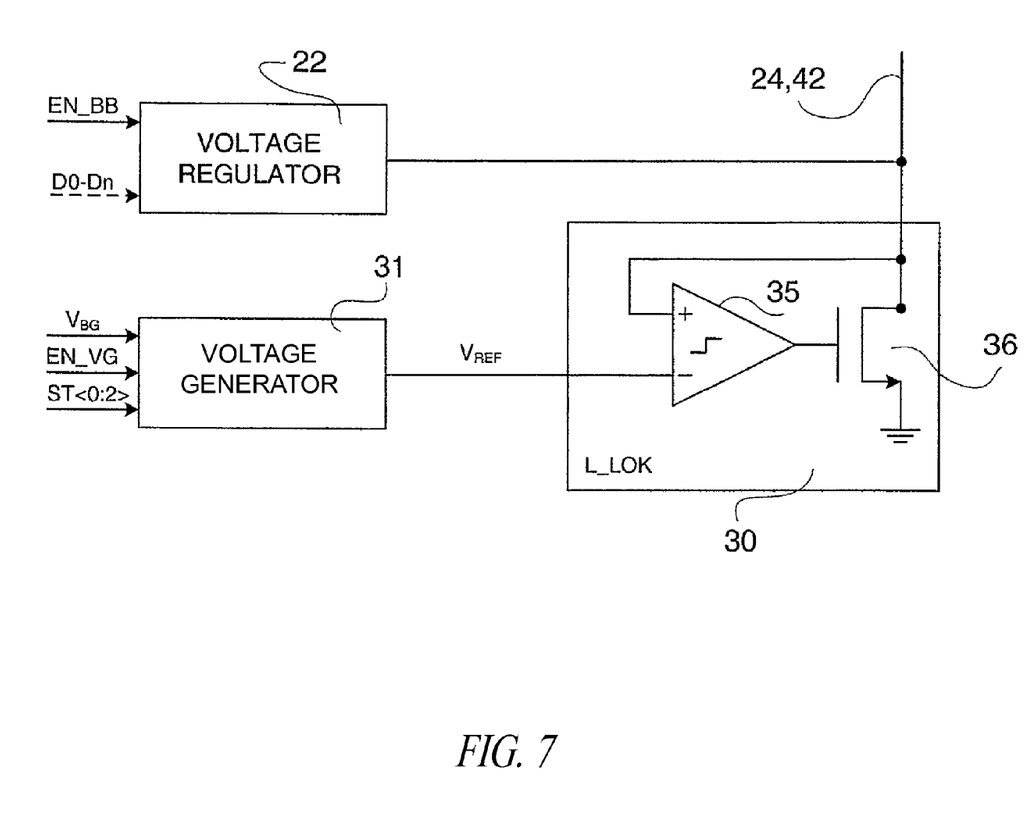
FIG. 7 shows a third embodiment of the present bitline discharge circuit.

FIG. 7 shows an embodiment, including the voltage regulation stage 22 of FIG. 2 or 3, an on-off regulator L_LOK 30 and a voltage generator 31.

In detail, the voltage regulator 30 comprises an hysteresis comparator 35 having an inverting input connected to an output of the voltage generator 31, and a non-inverting input connected to a discharge bus 24 or a global discharge bus 42, as explained more in detail hereinafter. An output of the hysteresis comparator 35 drives a drive element 36, here an NMOS transistor, having a drain terminal connected to the discharge bus 24, 42, a source terminal grounded and a gate terminal connected to the output of the hysteresis comparator 35.

The voltage generator 31 is any known circuit, e.g., a resistive divider, receiving a band-gap voltage $V_{BG}$ and generating a reference voltage $V_{REF}$ fed to the on-off regulator L_LOK 30. The reference voltage $V_{REF}$ is the desired value for the bus voltage VPY. The voltage generator 31 also receives a generator enable signal EN_VG and a trimming digital signal ST<0:2>, allowing trimming of the divider and thus of the reference voltage $V_{REF}$.

In FIG. 7, the voltage regulation stage 22 receives a regulation enable signal EN_BB. It may also received the control signals D0, D1, Dn of FIG. 3. Enable signals EN_VG and EN_BB are generated by a processing unit (not shown), controlling the operation of the entire memory device 1.

In use, when the bitline discharge unit 20 is to discharge a low current, e.g., during standby, only the voltage regulation stage 22 may be enabled through the regulation enable signal EN_BB, while the on-off regulator L_LOK 30 and the voltage generator 31 are off. In this situation, the bitline discharge unit 20 operates in the same manner as described with reference to FIG. 2 or 3.

Conversely, when the bitline discharge unit 20 is to discharge a high current (leakage and/or discharge current, for example during reading/writing), both the voltage regulation stage 22 and the on-off regulator L_LOK 30 are activated, through enable signals EN_VG and EN_BB. In such a situation, hysteresis comparator 35 and the drive element 36 discharge the excess current which cannot be disposed of by only the voltage regulation stage 22.

Alternatively, only the on-off voltage regulator 30 is activated. Activation of the voltage regulation stage 22 and the on-off regulator L_LOK 30 may also occur in a pulsated way, for example when it is desired to samplewise check the bus voltage VPY.

The off voltage regulator 30 may also be activated for limited times during the operation. For example, the off voltage regulator 30 may be activated during standby through a timer.

Figure 8:
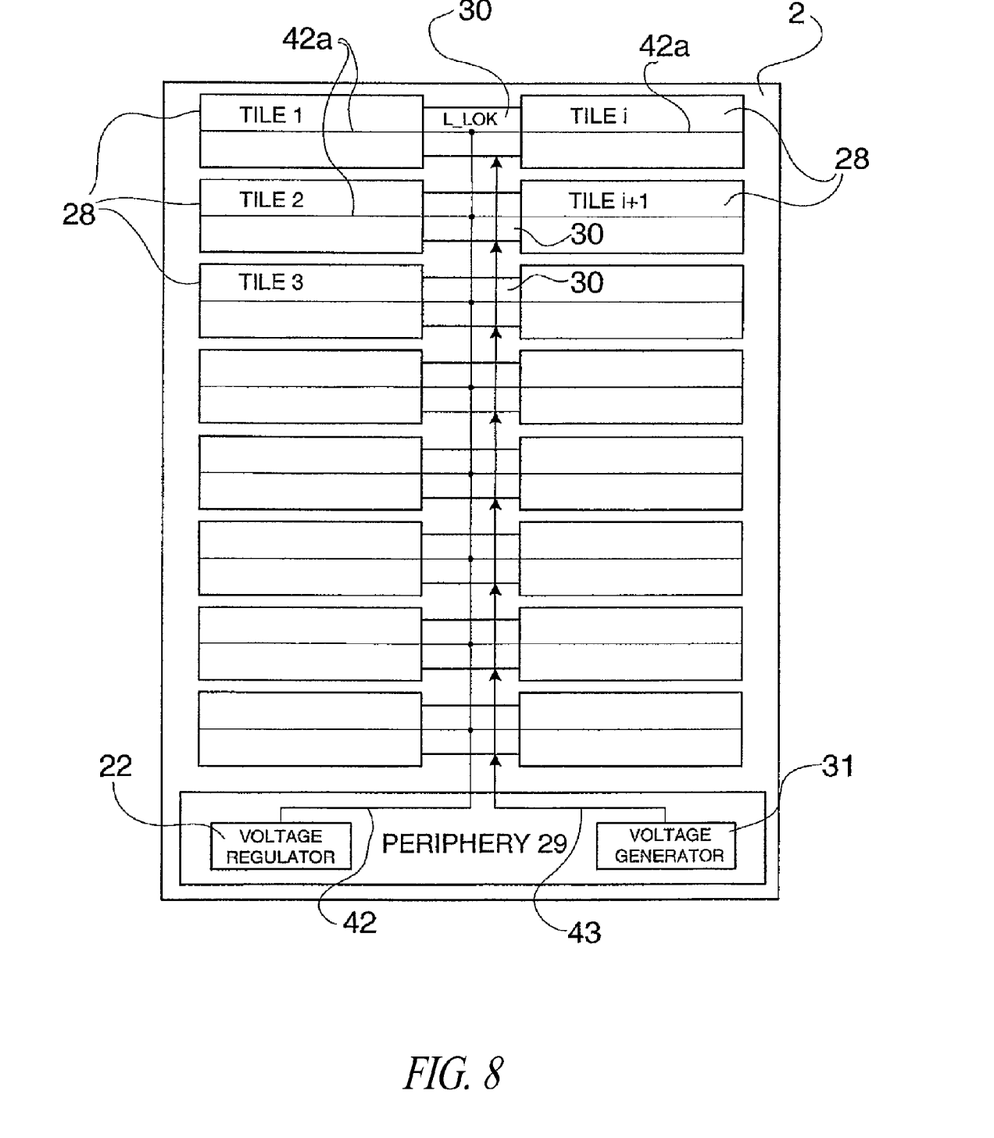
FIGS. 8 and 9 show respective architectures of a phase change memory device including the bitline discharge circuit of FIG. 7.

The scheme of FIG. 7 may arranged in the memory device 1 as shown in FIG. 8. Here, the voltage regulator 22 and the voltage generator 31 are arranged in the periphery portion 29 of the memory array 2 and are connected to the on-off regulator L_LOK through the global discharge bus 42 and a biasing line 43 formed in a high metallization level and extending throughout the height of the memory array 2. Here, a plurality of on-off regulators L_LOK 30 are arranged locally, each between a respective couple of adjacent tiles 28. Thus, the global discharge bus 42 and the biasing line 43 are connected to the on-off regulators L_LOK 30; furthermore, the global discharge bus 42 is connected to local discharge buses 42a, one for each tile. The local discharge buses 42a, in turn, are connected to the bitlines discharge switches 21, analogously to FIG. 6.

Such a solution allows a reduction in the space needed for the discharge bus and a local control of voltage applied to the deselected bitlines BL. In particular, the solution of FIG. 8 allows actuation of the on-off regulators L_LOK 30 only when the respective tiles 28 are subject to a specific operation (e.g., reading/writing) requesting the additional on-off control. Furthermore, the on-off regulators L_LOK 30 may be brought in a discharge disabling state. For example, the drive element 36 may be switched off to prevent the discharge of the deselected bitlines BL during the real reading/writing operation, that is when the sense amplifiers detect the current flowing in the selected bitlines. The drive element 36 is however on during the auxiliary operations, including addressing, biasing, equalizing etc., in order to avoid any disturbances caused by the capacitive coupling between the selected bitlines and the discharge buses 42a, which are locally discharged by the drive elements 36.

Thereby, the array ground may be exploited to drain the current due to the switching-on of the drive element 36, without the need of a dedicated bus extending from the periphery portion 29 to the enabled tile.

Figure 9:
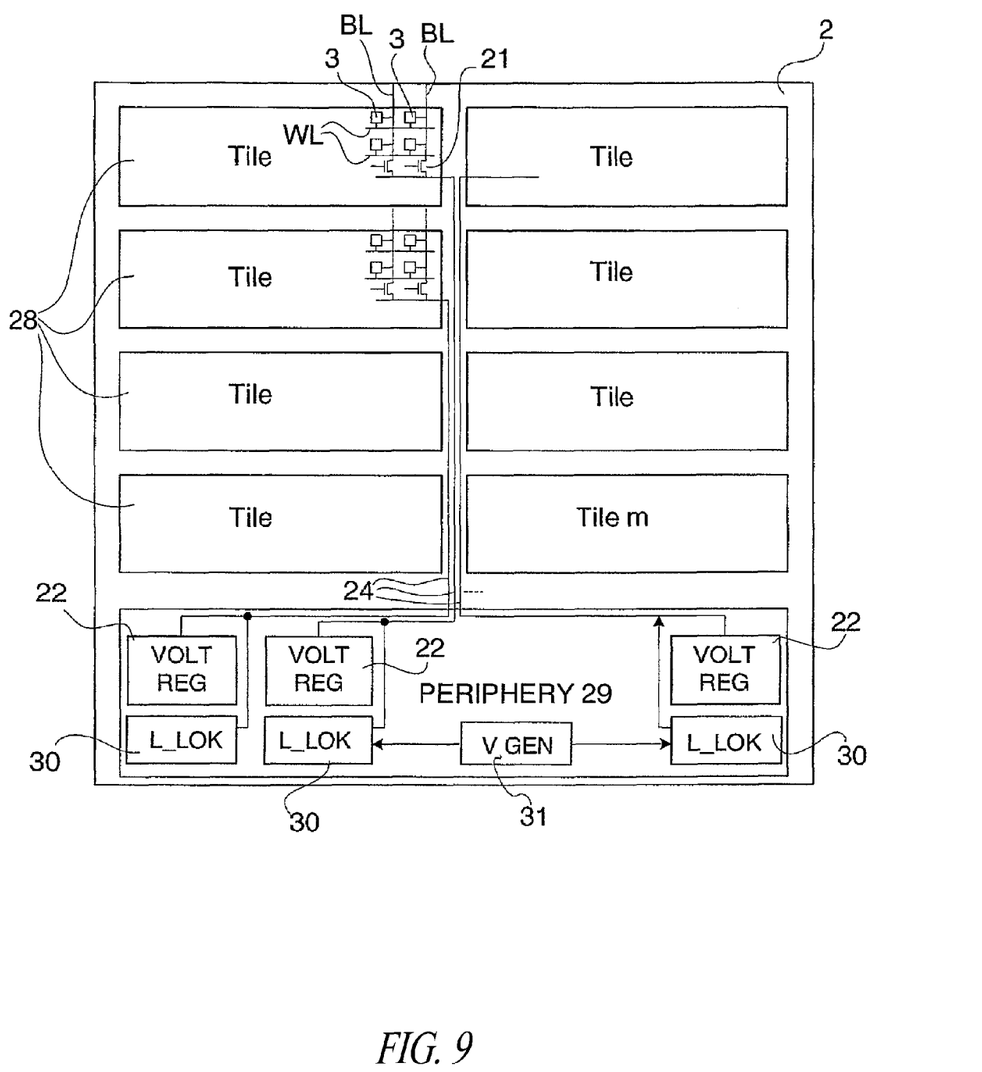

In the alternative, also the voltage generator 31 may be arranged locally, near the tiles 28 or a single on-off regulator L_LOK 30 or a plurality of on-off regulators L_LOK 30 (one for each tile 28) may be arranged in the periphery portion 29, as shown in FIG. 9. The selection between the local or the periphery arrangement of the on-off regulator L_LOK 30 (FIG. 8 or 9) may depend on the space available for the discharge buses 24, 42 and/or the voltage drop on the discharge buses that is acceptable for the specific memory device 1.

Figure 10:
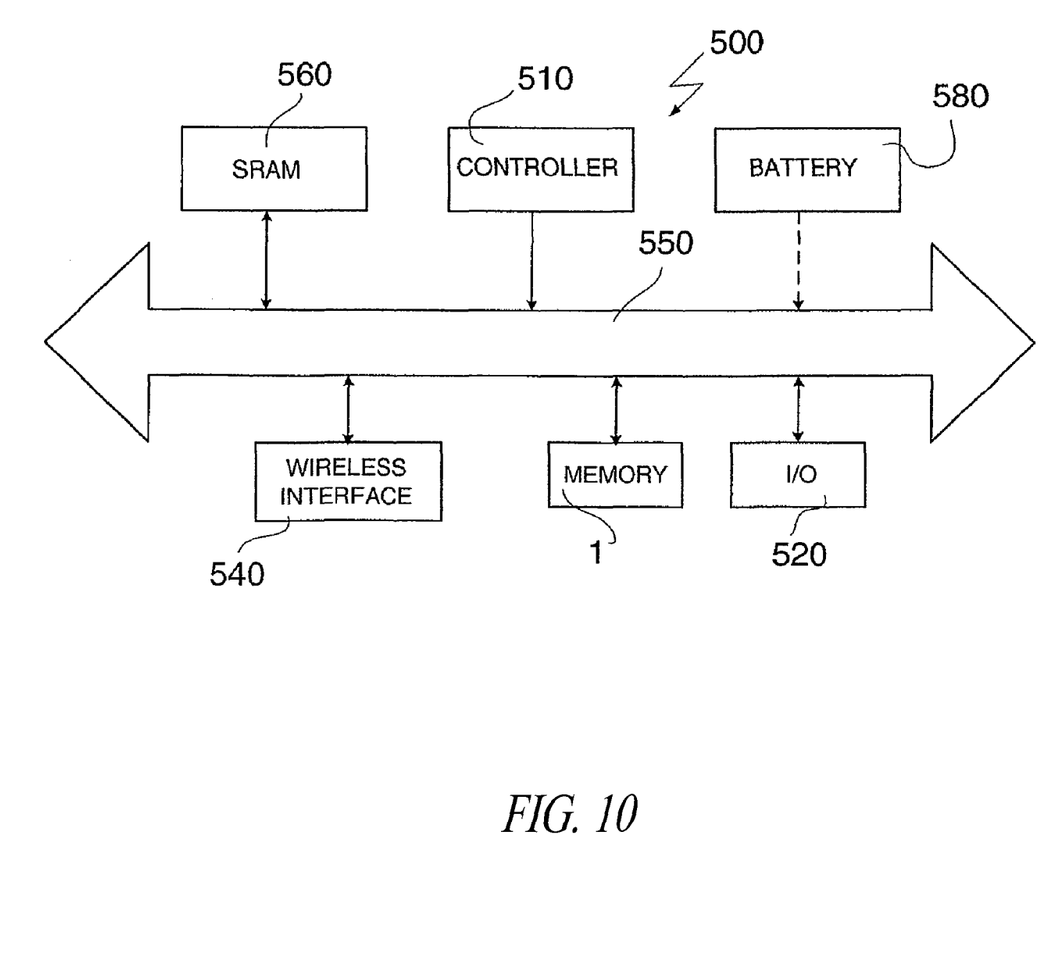
FIG. 10 is a system depiction for another embodiment of the disclosure.

FIG. 10 shows a portion of a system 500 in accordance with an embodiment of the present disclosure is described. System 500 may be used in wireless devices such as, for example, a personal digital assistant (PDA), a laptop or portable computer with wireless capability, a web tablet, a wireless telephone, a pager, an instant messaging device, a digital music player, a digital camera, or other devices that may be adapted to transmit and/or receive information wirelessly. System 500 may be used in any of the following systems: a wireless local area network (WLAN) system, a wireless personal area network (WPAN) system, a cellular network, although the scope of the present disclosure is not limited in this respect.

System 500 includes a controller 510, an input/output (I/O) device 520 (e.g., a keypad, display), static random access memory (SRAM) 560, a memory 1, and a wireless interface 540 coupled to each other via a bus 550. A battery 580 is used in some embodiments. It should be noted that the scope of the present disclosure is not limited to embodiments having any or all of these components.

Controller 510 comprises, for example, one or more microprocessors, digital signal processors, microcontrollers, or the like. Memory 1 may be used to store messages transmitted to or by system 500. Memory 1 may also optionally be used to store instructions that are executed by controller 510 during the operation of system 500, and may be used to store user data. Memory 1 may be provided by one or more different types of memory. For example, memory 1 may comprise any type of random access memory, a volatile memory, a non-volatile memory such as a flash memory and includes the phase change memory device according to FIGS. 2-9.

I/O device 520 may be used by a user to generate a message. System 500 uses wireless interface 540 to transmit and receive messages to and from a wireless communication network with a radio frequency (RF) signal. Examples of wireless interface 540 may include an antenna or a wireless transceiver, although the scope of the present disclosure is not limited in this respect.

The advantages of the present disclosure are clear from the above. In particular, it is underlined that the present voltage regulation stage is able to ensure the discharge of leakage currents through a simple circuit, which, in its minimum solution, only requires a simple transistor 25. Thus, the present solution is reliable, the required space is very small, and the associated costs are negligible. On the other hand, when the need arises, due, e.g., to the specific application and/or dimensions of the memory, it is possible to add other components to meet the requirements.

Finally, it is clear that numerous variations and modifications may be made to the phase change memory device described and illustrated herein, all falling within the scope of the disclosure as defined in the attached claims.

For example, the on-off regulator L_LOK 30 may be replaced with a linear voltage regulator; furthermore, the hysteresis comparator 35 may be replaced by a couple of comparators, respectively receiving a minimum or a maximum reference value, or by a single comparator receiving a maximum reference value, followed by a monostable circuit, as taught for example in U.S. Pat. No. 7,092,277.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A phase change memory device, comprising:
a memory array of memory cells arranged in a plurality of rows and columns, each memory cell including a phase change memory element and a selection element, the array comprising a plurality of wordlines and a plurality of bitlines, the memory cells of each row being coupled to a respective wordline and the memory cells of each column being coupled to a respective bitline,
a bitline biasing unit;
a bitline selection unit coupled to said bitlines and said bitline biasing unit and configured to connect a selected bitline to the bitline biasing unit and disconnect deselected bitlines from the bitline biasing unit in an operative condition of the memory device; and
a bitline discharge unit coupled to said bitlines, the bitline discharge unit including:
a voltage regulation unit, and
a plurality of bitline discharge switches, each bitline discharge switch being coupled between the voltage regulation unit and a respective bitline and controlled in said operative condition to connect the deselected bitlines to the voltage regulation unit and disconnect the selected bitline from the voltage regulation unit, wherein the memory array comprises a plurality of tiles, the bitline discharge unit includes a regulated voltage bus coupled to the bitline discharge switches, and the memory device includes a periphery portion extending laterally to said tiles, the voltage regulation unit being arranged in the periphery portion, and the regulated voltage bus comprises a global voltage bus extending through the memory array from the voltage regulation unit and a plurality of local voltage buses extending between the global voltage bus and the tiles, respectively.

2. The memory device according to claim 1, wherein the voltage regulation unit comprises a PMOS transistor having a first conduction terminal coupled to the regulated voltage bus, a second conduction terminal coupled to a reference potential line and a control terminal coupled to constant biasing voltage line.

3. The memory device according to claim 1, wherein each bitline discharge switch comprises a MOS transistor having a first conduction terminal connected to the respective bitline, a second conduction terminal connected to the regulated voltage bus and a gate terminal configured to receive a control signal.

4. The memory device according to claim 1, further comprising a close-loop voltage regulator including a voltage comparator having a first input configured to receive a reference voltage, a second input connected to the regulated voltage bus and an output coupled to the regulated voltage bus.

5. The memory device according to claim 4, wherein the voltage comparator is an on-off comparator and wherein the close-loop voltage regulator includes a drive element coupled between the output of the voltage comparator and the regulated voltage bus.

6. The memory device according to claim 4, wherein the close-loop voltage regulator is arranged in the periphery portion.

7. The memory device according to claim 1, further comprising:
a close-loop voltage regulator including a plurality of voltage comparators each having a first input configured to receive a reference voltage, a second input connected to the regulated voltage bus and an output coupled to the regulated voltage bus, the voltage comparators being arranged adjacent to said tiles.

8. The memory device according to claim 7, wherein the tiles are arranged in pairs of adjacent tiles, wherein the voltage comparators are arranged between the tiles of each pair of adjacent tiles.

9. A system, comprising:
a controller; and
phase change memory device coupled to the controller, the memory device including:
a memory array of memory cells arranged in a plurality of rows and columns, each memory cell including a phase change memory element and a selection element, the array comprising a plurality of wordlines and a plurality of bitlines, the memory cells of each row being coupled to a respective wordline and memory cells of each column being coupled to a respective bitline,
a bitline biasing unit;
a bitline selection unit coupled to said bitlines and said bitline biasing unit and configured to connect a selected bitline to the bitline biasing unit and disconnect deselected bitlines from the bitline biasing unit in an operative condition of the memory device; and
a bitline discharge unit coupled to said bitlines, the bitline discharge unit including:
a voltage regulation unit, and
a plurality of bitline discharge switches, each bitline discharge switch being coupled between the voltage regulation unit and a respective bitline and controlled in said operative condition to connect the deselected bitlines to the voltage regulation unit and disconnect the selected bitline from the voltage regulation unit, wherein the memory array comprises a plurality of tiles, the bitline discharge unit includes a regulated voltage bus coupled to the bitline discharge switches, and the memory device includes a periphery portion extending laterally to said tiles, the voltage regulation unit being arranged in the periphery portion, and the regulated voltage bus comprises a global voltage bus extending through the memory array from the voltage regulation unit and a plurality of local voltage buses extending between the global voltage bus and the tiles, respectively.

10. The system of claim 9, wherein the voltage regulation unit comprises a PMOS transistor having a first conduction terminal coupled to the regulated voltage bus, a second conduction terminal coupled to a reference potential line and a control terminal coupled to constant biasing voltage line.

11. The system of claim 9, wherein each bitline discharge switch comprises a MOS transistor having a first conduction terminal connected to the respective bitline, a second conduction terminal connected to the regulated voltage bus and a gate terminal configured to receive a control signal.

12. The system of claim 9, wherein the memory device further includes a close-loop voltage regulator including a voltage comparator having a first input configured to receive a reference voltage, a second input connected to the regulated voltage bus and an output coupled to the regulated voltage bus.

13. The system of claim 12, wherein the close-loop voltage regulator is arranged in the periphery portion.

14. The system of claim 9, wherein the memory device includes:
a close-loop voltage regulator including a plurality of voltage comparators each having a first input configured to receive a reference voltage, a second input connected to the regulated voltage bus and an output coupled to the regulated voltage bus, the voltage comparators being arranged adjacent to said tiles.

15. The system of claim 14, wherein the tiles are arranged in pairs of adjacent tiles, wherein the voltage comparators are arranged between the tiles of each pair of adjacent tiles.

16. A phase change memory device, comprising:
an array of memory cells arranged in a plurality of rows and columns, each memory cell including a phase change memory element and a selection element, the array comprising a plurality of wordlines and a plurality of bitlines, the memory cells of each row being coupled to a respective wordline and the memory cells of each column being coupled to a respective bitline,
a bitline biasing unit;
a bitline selection unit coupled to said bitlines and said bitline biasing unit and configured to connect a selected bitline to the bitline biasing unit and disconnect deselected bitlines from the bitline biasing unit in an operative condition of the memory device;
a bitline discharge unit coupled to said bitlines, the bitline discharge unit including:
a voltage regulation unit, and
a plurality of bitline discharge switches, each bitline discharge switch being coupled between the voltage regulation unit and a respective bitline and controlled in said operative condition to connect the deselected bitlines to the voltage regulation unit and disconnect the selected bitline from the voltage regulation unit, wherein the memory array comprises a plurality of tiles, and the bitline discharge unit includes a regulated voltage bus coupled to the bitline discharge switches;

a periphery portion extending laterally to said tiles; and a close-loop voltage regulator including a plurality of voltage comparators each having a first input configured to receive a reference voltage, a second input coupled to the regulated voltage bus and an output coupled to the regulated voltage bus, the voltage regulation unit being arranged in the periphery portion and the voltage comparators being arranged adjacent to said tiles.

17. The memory device according to claim 16, wherein the tiles are arranged in pairs of adjacent tiles, wherein the voltage comparators are arranged between the tiles of each pair of adjacent tiles.

18. The memory device according to claim 16, further comprising a close-loop voltage regulator including a voltage comparator having a first input configured to receive a reference voltage, a second input connected to the regulated voltage bus and an output coupled to the regulated voltage bus.

19. A system, comprising:
a controller; and
phase change memory device coupled to the controller, the memory device including:
an array of memory cells arranged in a plurality of rows and columns, each memory cell including a phase change memory element and a selection element, the array comprising a plurality of wordlines and a plurality of bitlines, the memory cells of each row being coupled to a respective wordline and the memory cells of each column being coupled to a respective bitline,
a bitline biasing unit;
a bitline selection unit coupled to said bitlines and said bitline biasing unit and configured to connect a selected bitline to the bitline biasing unit and disconnect deselected bitlines from the bitline biasing unit in an operative condition of the memory device; and
a bitline discharge unit coupled to said bitlines, the bitline discharge unit including:
a voltage regulation unit, and
a plurality of bitline discharge switches, each bitline discharge switch being coupled between the voltage regulation unit and a respective bitline and controlled in said operative condition to connect the deselected bitlines to the voltage regulation unit and disconnect the selected bitline from the voltage regulation unit, wherein the memory array comprises a plurality of tiles, the bitline discharge unit includes a regulated voltage bus coupled to the bitline discharge switches, and the memory device includes:
a periphery portion extending laterally to said tiles; and
a close-loop voltage regulator including a plurality of voltage comparators each having a first input configured to receive a reference voltage, a second input connected to the regulated voltage bus and an output coupled to the regulated voltage bus, the voltage regulation unit being arranged in the periphery portion and the voltage comparators being arranged adjacent to said tiles.

20. The system of claim 19, wherein the tiles are arranged in pairs of adjacent tiles, wherein the voltage comparators are arranged between the tiles of each pair of adjacent tiles.

21. The system of claim 19, wherein the memory device further includes a close-loop voltage regulator including a voltage comparator having a first input configured to receive a reference voltage, a second input connected to the regulated voltage bus and an output coupled to the regulated voltage bus.

* * * * *